(12) United States Patent
Sugai et al.

(10) Patent No.: US 6,368,981 B1
(45) Date of Patent: Apr. 9, 2002

(54) METHOD OF MANUFACTURING SEMICONDUCTOR DEVICE AND CHEMICAL MECHANICAL POLISHING APPARATUS

(75) Inventors: Kazumi Sugai; Yasuaki Tsuchiya, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/635,560

(22) Filed: Aug. 10, 2000

(30) Foreign Application Priority Data

Aug. 10, 1999 (JP) .......................................... 10-226900

(51) Int. Cl.[7] ...................... H01L 21/302; H01L 21/461
(52) U.S. Cl. ...................... 438/745; 438/627; 438/629; 438/633; 438/692; 438/693
(58) Field of Search ................................ 438/745, 627, 438/629, 633, 648, 656, 643, 645, 653, 669, 672, 685, 687, 692, 693; 216/38, 13, 53, 88, 86, 84, 89, 39; 451/41, 443

(56) References Cited

U.S. PATENT DOCUMENTS

| | | | |
|---|---|---|---|
| 5,605,499 A | * 2/1997 | Sugiyama et al. | .......... 451/443 |
| 5,830,806 A | * 11/1998 | Hudson et al. | .............. 438/690 |
| 6,001,730 A | * 12/1999 | Farkas et al. | ............... 438/627 |
| 6,184,141 B1 | * 2/2001 | Avanzino et al. | ........... 438/692 |
| 6,227,955 B1 | * 5/2001 | Custer et al. | ............... 451/285 |
| 6,248,006 B1 | * 6/2001 | Mukhopadhyay et al. | .. 451/285 |
| 2001/0013503 A1 | * 8/2001 | Custer et al. | ................. 216/38 |

FOREIGN PATENT DOCUMENTS

EP          1 111 665 A2 * 6/2001

* cited by examiner

*Primary Examiner*—Matthew Smith
*Assistant Examiner*—Igwe U. Anya
(74) *Attorney, Agent, or Firm*—Sughrue Mion, PLLC

(57) ABSTRACT

A buried wiring line is formed without dishing using damascene and chemical mechanical polishing (CMP) processes. A key feature is the use of a first and a second pressure unit. The first pressure unit (15) has an airbag (18). The bag (18) is large in elastic deformation, and used to urge a copper film (5) of a silicon substrate (1) against a polishing pad (12) onto which a polishing liquid is supplied while the pad (12) is rotated, so that the copper film (5) is polished. The copper film (5) has been formed on the surface of the silicon substrate (1) through a barrier metal film (4). After polishing of the copper film (5), the silicon substrate (1) is transferred to the second pressure unit (25). The unit (25) has a metal plate (20). The plate (20) is small in deformation and used to urge the exposed barrier metal film (4) against the polishing pad (12) onto which the polishing liquid is supplied while the pad (12) is rotated, so that the barrier metal film (4) is polished to form the buried wiring line without dishing.

18 Claims, 8 Drawing Sheets

METHOD OF MANUFACTURING SEMICONDUCTOR DEVICE AND CHEMICAL MECHANICAL POLISHING APPARATUS

BACKGROUND OF THE INVENTION

1. Field of the Invention

The present invention relates to a method of manufacturing a semiconductor device and a Chemical Mechanical Polishing (CMP) apparatus employed therein, more particularly to a method and an apparatus using a damascene CMP process that prevents a so-called "dishing problem" in producing a buried wiring line.

2. Description of the Related Art

In LSI (Large Scale Integrated) circuits such as microprocessors, memories and a like, there is substantial incentive toward higher levels of integration density and design rules permitting smaller minimum feature sizes for individual circuit components or devices. In other words, as a semiconductor industry moves toward smaller and smaller device dimensions, a greater density of devices per silicon substrate is required. As the device dimensions shrink, width of wiring trenches or holes formed in insulation films also shrinks. Further, since wiring density has increased as described above, a so-called "multilevel metallization technology" has been developed, wherein a plurality of layers each of which is provided with a wiring line and a thickness are stacked together into a stack to form a semiconductor device.

In LSI circuits described above, such narrow dimensions of wiring lines lead to higher resistances, and therefore affect devices in their characteristics such as operation speeds and a like. Consequently, it is required to reduce resistance in the wiring lines. As conventional wiring materials for semiconductor devices such as LSI circuits and a like, there are aluminum (Al) or aluminum-based alloys, which are excellent in electric properties and workability. However, the aluminum-based alloys are poor in resistance to electromigration and stress-migration. Under such circumstances, there are increasing tendencies to use copper (Cu) or copper-based alloys in place of the aluminum-based alloys since the copper-based alloys are excellent in resistance to electromigration and stress-migration and smaller in electric resistance than the aluminum-based alloys.

On an other hand, as one of conventional structures adapted for use with a fine wiring line, there is a damascene wiring structure in which a trench for forming the wiring line (hereinafter referred to as a wiring line trench) is formed in an insulation film, and filled with metal to produce a buried wiring line. FIG. 7 is a sectional view of a silicon substrate, illustrating a typical damascene structure. For example, as shown in FIG. 11 in which the dishing 57 is exaggerated, an insulation film 52 which is constructed of a silicon oxide film is formed on a top surface of silicon substrate 51. In the insulation film 52, a wiring line trench 53 is previously formed. A copper film 55 is formed in the wiring line trench 53 through a barrier metal film 54 made of tantalum (Ta), so that a buried wiring line 56 constructed of these films 54, 55 is formed. The buried wiring line 56 has its surface polished to a flat mirror finish by a well-known CMP process. In the buried wiring line 56, the barrier metal film 54 serves as a diffusion barrier film to prevent electro-migration of copper from the copper film 55 to the insulation film 52 and further to the silicon substrate 51 through the insulation film 52.

With reference to FIGS. 8A, 8B and 8C, a conventional method of manufacturing a semiconductor device will be now described step by step.

First, as shown in FIG. 8A, for example, the insulation film 52, which is constructed of a silicon oxide film or a like, is formed over an entire surface of the silicon substrate 51 by a chemical vapor deposition (CVD) process or a like. Then, by using a well-known photolithographic process, the wiring line trench 53 is formed in the insulation film 52 to reach some midpoint in depth of the insulation film 52. After that, as shown in FIG. 8B, by using a sputtering process or a like, the barrier metal film 54 (made of tantalum) and the copper film 55 are sequentially formed in this order over the entire surface of the silicon substrate 51 through the insulation film 52 provided with the wiring line trench 53.

Then, the silicon substrate 51 is transferred to a CMP unit for performing the CMP process. Using this CMP unit, as shown in FIG. 8C, the copper film 55 formed on an uppermost surface of the barrier metal film 54 is removed by polishing. Then, as shown in FIG. 11, the copper film 55 and the barrier: metal film 54 both formed on the silicon substrate 51 is removed by polishing, so that the buried wiring line 56 is formed, whereby the semiconductor device is completed, wherein the dishing 57 is shown in exaggerated form for clarification.

FIG. 9 shows a cross-sectional view of the conventional CMP unit 60 used in the CMP process described above. As shown in FIG. 9, the conventional CMP unit 60 is provided with a polishing platen 61 to which a polishing pad 62 is attached. The polishing pad 62 is brought into contact with a surface of the silicon substrate 51 being polished. In operation, the polishing platen 61 is rotatably driven through its rotating shaft 63 in a condition in which a polishing or abrasive liquid is supplied from an abrasive liquid supply nozzle 64 onto the polishing pad 62 and retained thereon.

On an other hand, as is clear from FIG. 9, a pressure unit 65 for holding and forcing the silicon substrate 51 being polished is disposed above the polishing platen 61. The pressure unit 65 is provided with a metal head 66 and a retainer 67 on which the metal head 66 is fixedly mounted. These components 66, 67 of the pressure unit 65 define a space for receiving therein an air bag 68. The air bag 68 serves as a flexible element, is brought into press-contact with a rear surface of the silicon substrate 51, and functions to force the silicon substrate 51 against the polishing pad 62 which is rotatably driven when the pressure unit 65 is rotatably driven by its rotating shaft 69.

In a polishing operation in which the conventional CMP unit 60 shown in FIG. 9 is used: first, the silicon substrate 51 which is still in the step of FIG. 8B has its top surface brought into contact with the polishing pad 62; and then, the abrasive liquid is supplied from the abrasive liquid supply nozzle 64 onto the polishing pad 62 in a condition in which both the polishing platen 61 and the pressure unit 65 are rotatably driven; whereby the copper film 55 of the silicon substrate 51 is polished, as shown in FIG. 8C. In this case, since the air bag 68 which is large in elastic deformation is used to force a front surface of the silicon substrate 51 against the polishing pad 62 of the polishing platen 61 during the polishing operation, it is possible to polish a top surface of the copper film 55 to a flat mirror finish (shown in FIG. 8C). In the conventional case, a same polishing operation is repeatedly performed to form the buried wiring line 56 of the semiconductor device (shown in FIG. 11 in which the dishing 57 is exaggerated) until the barrier metal film 54 formed on an uppermost surface of the insulation film 52 of the silicon substrate 51 is completely removed.

As described above, when the barrier metal film 54 and the copper film 55 both formed on the top surface of the silicon substrate 51 through the insulation film 52 are removed by the CMP process to form the buried wiring line 56 in the conventional method of manufacturing the semiconductor device, the same pressure unit 65 is repeatedly used in individual process steps for polishing the copper film 55 and for polishing the barrier metal film 54 in a condition in which the air bag 68 continuously forces the front surface of the silicon substrate 51 against the polishing pad 62 of the polishing platen 61.

As is clear from the above, in the conventional method of manufacturing the semiconductor device, since the same pressure unit 65 is used in polishing the barrier metal film 54 in a condition in which the air bag 68 forces the silicon substrate 51 against the polishing pad 62, the copper film 55 is also polished and partially removed to cause a dishing problem (shown in FIG. 11). More specifically, when the copper film 55 and the barrier metal film 54 are polished by the CMP process using the same pressure unit 65, ratio of the removal rate, of the copper film 55 to removal rate of the barrier metal film 54 tends to decrease. Due to this, the copper film 55 is also polished when the barrier metal film 54 is polished. As a result, as shown in FIG. 11, the dishing 57 is formed in the top surface of the copper film 55. In case that the plurality of trenches each having a narrow width are formed in the area of the surface of the insulation film 52 so as to be spaced apart from each other at predetermined intervals and filled with copper to form a plurality of copper films 55 in the area, the area tends to cause erosion 58 in which the entire surface of the area is formed into a dish-like shape when subjected to the CMP process.

As described above, a phenomenon that the ratio of the removal rate of the copper film 55 to the removal rate of the barrier metal film 54 reduces occurs not only in cases where the pressure unit 65 (shown in FIG. 9) provided with the flexible element or air bag 68 which is large in deformation is used, but also in cases where a pressure unit 75 (shown in FIG. 10) provided with a flexible element which is small in deformation and constructed of a metal plate 70 made of stainless steel or like metal is used.

SUMMARY OF THE INVENTION

In view of the above, it is an object of the present invention to provide a method of manufacturing a semiconductor device and an apparatus for performing a chemical mechanical polishing process employed in the above method, which is capable of, preventing a copper film from being over-polished when a barrier metal film is polished by the chemical mechanical polishing process for producing a buried wiring line.

According to a first aspect of the present invention, there is provided a method of manufacturing a semiconductor device, wherein after a trench for a wiring line is formed in an insulation film covering a surface of a semiconductor substrate, a first and a second metal film are subsequently formed over an entire surface of the insulation film including the trench; and, the first and the second metal film formed on a top surface of the semiconductor substrate through the insulation film are subsequently polished by a chemical mechanical polishing process to form a buried wiring line, the method including:

a first polishing step for polishing the second metal film in a condition in which a polishing liquid is supplied to a polishing platen, and the semiconductor substrate having its surface forced against the polishing platen is brought into press-contact with a first flexible element which is large in deformation; and a second polishing step for polishing the first metal film in a condition in which a polishing liquid is supplied to the polishing platen, and the semiconductor substrate having its surface forced against the polishing platen is brought into press-contact with a second flexible element which is small in deformation.

According to a second aspect of the present invention, there is provided a method of manufacturing a semiconductor device, wherein after a trench for a wiring line is formed in an insulation film covering a surface of a semiconductor substrate, a first and a second metal film are subsequently formed over an entire surface of the insulation film including the trench; and, the first and the second metal film formed on a top surface of the semiconductor substrate through the insulation film are subsequently polished by a chemical mechanical polishing process to form a buried wiring line, the method including:

a first polishing step for polishing the second metal film in a condition in which a polishing liquid is supplied to a polishing platen, and the semiconductor substrate having its surface forced against the polishing platen is brought into press-contact with a first pressure unit provided with a first flexible element which is large in deformation; and a second polishing step for polishing the first metal film in a condition in which a polishing liquid is supplied to the polishing platen, and the semiconductor substrate having its surface forced against the polishing platen is brought into press-contact with a second pressure unit provided with a second flexible element which is small in deformation.

In the foregoing, a preferable mode is one wherein the first polishing step is performed in a manner such that a part of the second metal-film formed on the top surface of the semiconductor substrate still remains after completion of performance of the first polishing step.

Also, a preferable mode is one wherein the polishing liquid is shared by both the first and the second polishing step.

Also, a preferable mode is one wherein the polishing liquid used in the second polishing step is different from that used in the first polishing step.

Also, a preferable mode is one wherein the trench for the wiring line is constructed of: a trench portion a depth of which reaches some midpoint in film thickness of the insulation film; and, a via hole forming a through-hole of the insulation film, the through-hole extending in a direction perpendicular to the top surface of the semiconductor substrate.

Further, a preferable mode is one wherein the first metal film is made of barrier metal which is capable of forming a barrier metal film; and, the second metal film is made of copper or copper-based alloys.

Still further, a preferable mode is one wherein the barrier metal is tantalum or tantalum nitride.

According to a third aspect of the present invention, there is provided a chemical mechanical polishing apparatus provided with a polishing platen for sequentially polishing a second and a first metal film both formed on a top surface of a semiconductor substrate through an insulation film including a trench for a wiring line, wherein the first and the second metal film are sequentially formed over an entire top surface of the semiconductor substrate through the insulation film, the chemical mechanical polishing apparatus including:

a first pressure unit provided with a first flexible element which is large in deformation, the first flexible element forcing the semiconductor substrate against the polishing platen when the second metal film is polished; and a second pressure unit provided with a second flexible element which is small in deformation, the second flexible element forcing a rear surface of the semiconductor substrate when the first metal film is polished.

In the foregoing third aspect, a preferable mode is one wherein the first flexible element which is large in deformation is constructed of an air bag filled with a pressurized fluid.

Also, a preferable mode is one wherein the first flexible element which is large in deformation is constructed of a rubber member mounted on a surface of the polishing platen.

Also, a preferable mode is one wherein the second flexible element which is small in deformation is constructed of a metal plate.

With the above configurations, it is possible to increase a ratio of removal rate of the copper film to removal by using a relatively simple construction and accordingly to prevent a dishing problem of a buried wiring line.

BRIEF DESCRIPTION OF THE DRAWINGS

The above and other objects, advantages and features of the present invention will be more apparent from the following description taken in conjunction with accompanying drawings in which.

DETAILED DESCRIPTION OF THE PREFERRED EMBODIMENTS

Figure 1A:
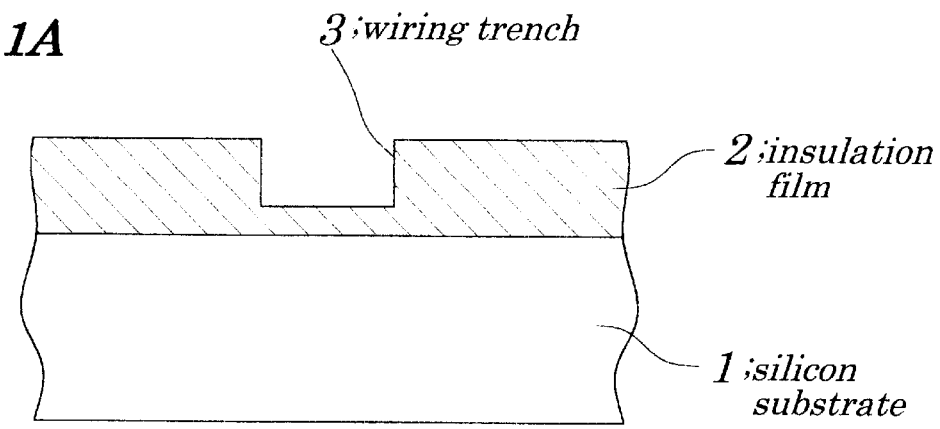
FIG. 1A is a sectional view of a silicon substrate coated with an insulation film, illustrating a first process step of a method of a first embodiment of the present invention for manufacturing a semiconductor device.

The best modes for carrying out the present invention will be described in detail using a plurality of embodiments with reference to accompanying drawings.

The present invention may, however, be embodied in various different forms, and therefore should not be construed as limited to these embodiments set forth herein; rather, these embodiments are provided so that this disclosure will be thorough and complete, and will fully convey a scope of the present invention to those skilled in the art.

In the accompanying drawings, the thickness of films and regions are exaggerated for clarity. Like reference numerals refer to like parts throughout drawings.

Incidentally, it will also be understood that when a film is referred to as being "on" another film or substrate, it can be directly on such other film or substrate, or intervening films may also be present therebetween.

FIRST EMBODIMENT

FIGS. 1A, 1B, 1C, 2A and 2B show a series of process steps of a first embodiment of a method of the present invention for manufacturing a semiconductor device.

Now, with reference to these drawings, the method of the present invention will be described in an order of the process steps of the method.

First, as shown in FIG. 1A, an insulation film 2 which is constructed of a silicon oxide film or a like having a film thickness of from 1.0 $\mu$m to 3.0 $\mu$m is formed over an entire top surface of a silicon substrate 1 having a thickness of from 600 $\mu$m to 800 $\mu$m using a chemical vapor deposition (CVD) process or a like. Then, by using a well-known photolithographic process, a trench 3 for a wiring line (herein after referred to as a wiring trench 3) is formed in the insulation film 2 to reach a midpoint of from 0.22 m to 2.5 $\mu$m in depth or film thickness of the insulation film 2. In this case, a width of the wiring trench 3 is within a range of from 0.15 $\mu$m to 100 $\mu$m.

Figure 1B:
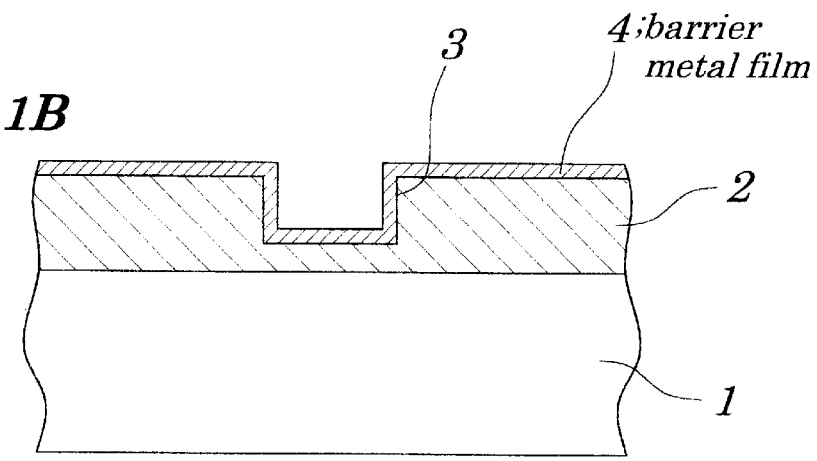
FIG. 1B is a sectional view of the silicon substrate further coated with a barrier metal film, illustrating a second process step of the method of the first embodiment.
Figure 1C:
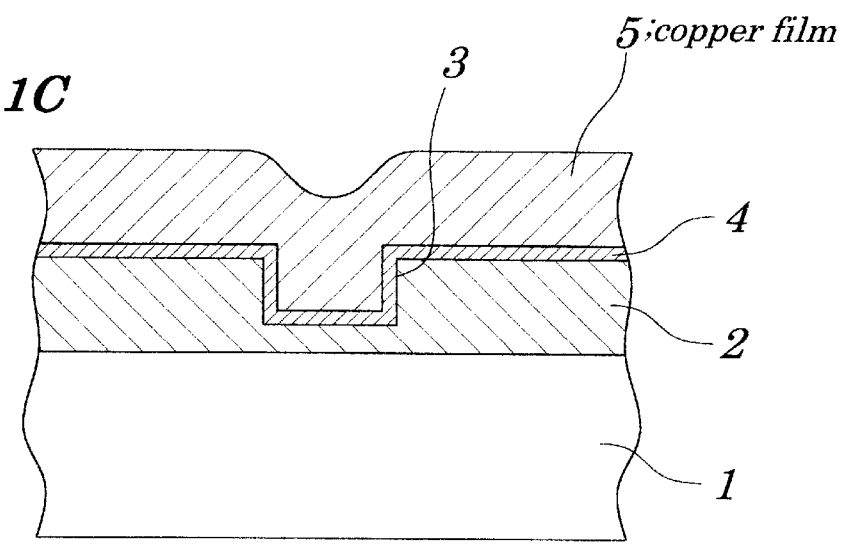
FIG. 1C is a sectional view of the silicon substrate still further coated with a copper film, illustrating a third process step of the method of the first embodiment.

After that, as shown in FIG. 1B, by using a sputtering process or a like, a barrier metal film 4 which is constructed of a tantalum film having a film thickness of from 10 nm to 80 nm is formed over an entire top surface of the insulation film 2 including the wiring trench 3. Subsequent to this, as shown in FIG. 1C, by using the sputtering process and a plating process combined therewith, a copper film 5 having a film thickness of from 0.5 μm to 3.0 μm is formed over an entire surface of the barrier metal film 4.

Figure 2A:
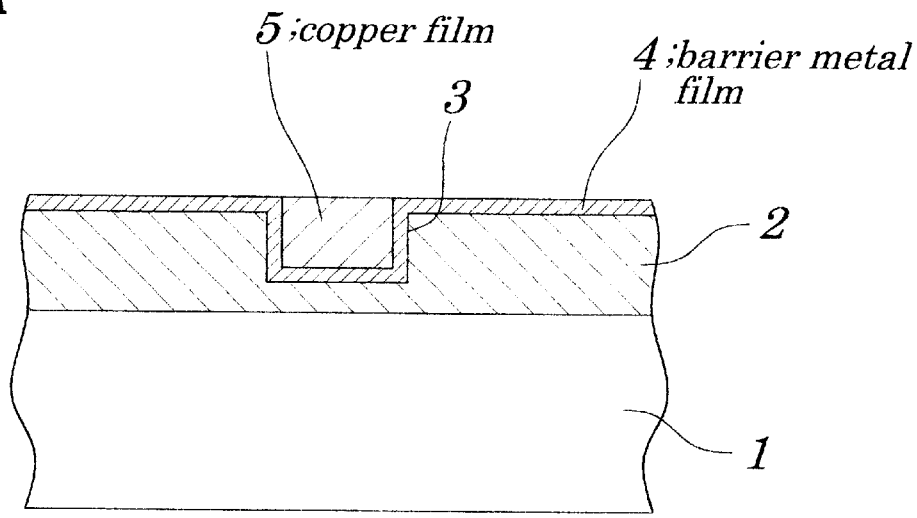
FIG. 2A is a sectional view of the silicon substrate having the copper film polished, illustrating a fourth process step of the method of the first embodiment.
Figure 2B:
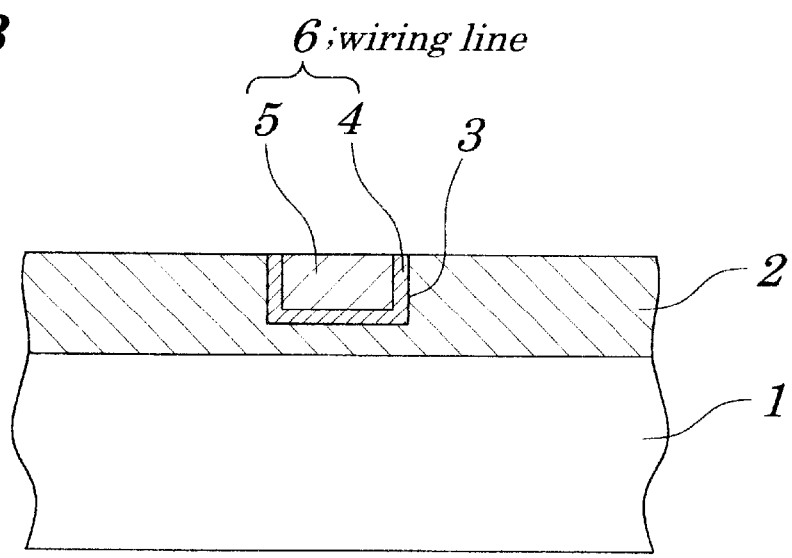
FIG. 2B is a sectional view of the silicon substrate having the barrier metal film polished, illustrating a fifth process step of the method of the first embodiment.

Then, as shown in FIG. 2A, the silicon substrate or silicon substrate 1 thus prepared is transferred to a CMP unit in which: the copper film 5 formed on a top surface of the barrier metal film 4 is removed by the CMP process. After that, as shown in FIG. 2B, the barrier metal film 4 formed on the top surface of the insulation film 2 is removed by a CMP process, so that a buried wiring line 6 is formed. As will be described later, the CMP process includes two polishing steps in the third embodiment.

Now, characterized features of the first embodiment will be described in detail.

Figure 4:
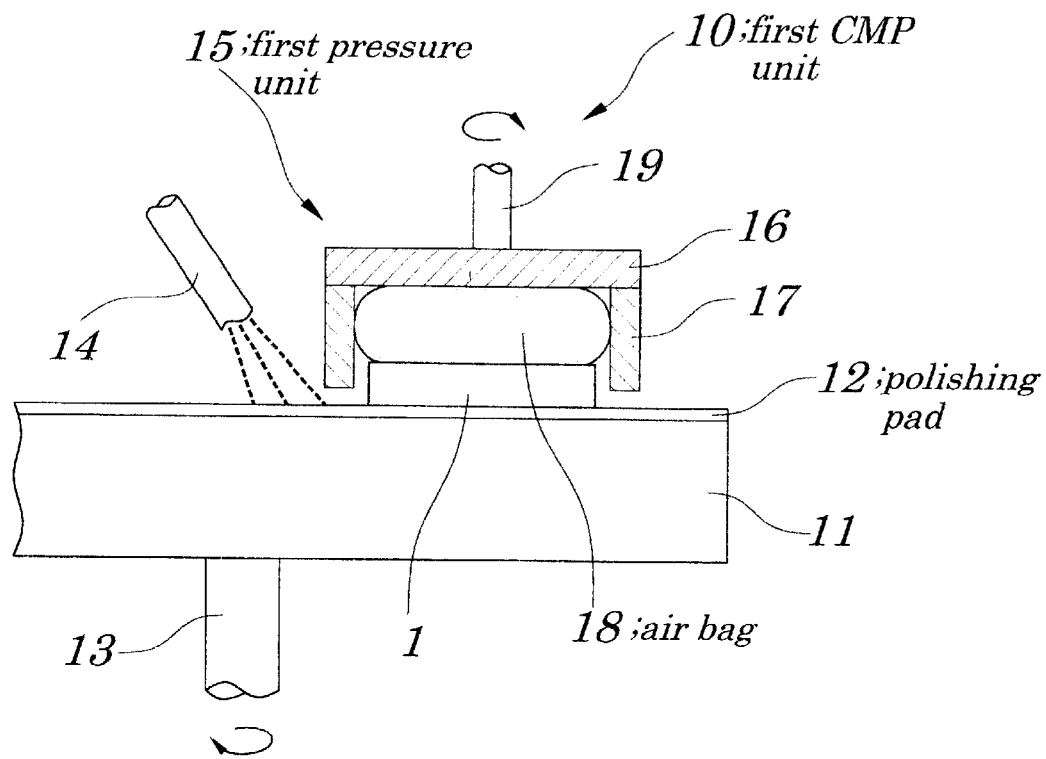
FIG. 4 is a sectional view of a first CMP unit used in the method of the present invention for manufacturing the semiconductor device.

As shown in FIG. 4 which is a sectional view of a first CMP unit 10 used in the CMP process described above, the first CMP unit 10 is provided with a polishing platen 11 on a top surface of which a polishing pad 12 is mounted. In polishing operation, the polishing pad 12 is brought into press-contact with a surface of the silicon substrate 1 being polished in a condition in which: the polishing platen 11 is rotatably driven through its rotating shaft 13; and, a polishing liquid is supplied from a polishing liquid supply nozzle 14 onto the polishing pad 12.

On the other hand, disposed over the polishing platen 11 is a first pressure unit 15 for holding and forcing the silicon substrate 1 being polished against the polishing platen 11 through the polishing pad 12. The first pressure unit 15 is provided with a metal head 16 and a retainer 17. The retainer 17 is mounted on the metal head 16 to define a space for receiving therein a first flexible element such as an air bag 18 or a like which is large in elastic deformation. In operation, the air bag 18 functions to force a rear surface of the silicon substrate 1 downward. On an other hand, the first pressure unit 15 is rotatably driven through its rotating shaft 19, as shown in FIG. 4. The first flexible element, or air bag 18 which is large in elastic deformation forces the rear surface of the silicon substrate 1 downward, as viewed in FIG. 4, so that the silicon substrate 1 has its front surface forced against the polishing pad 12 of the polishing platen 11.

Figure 5:
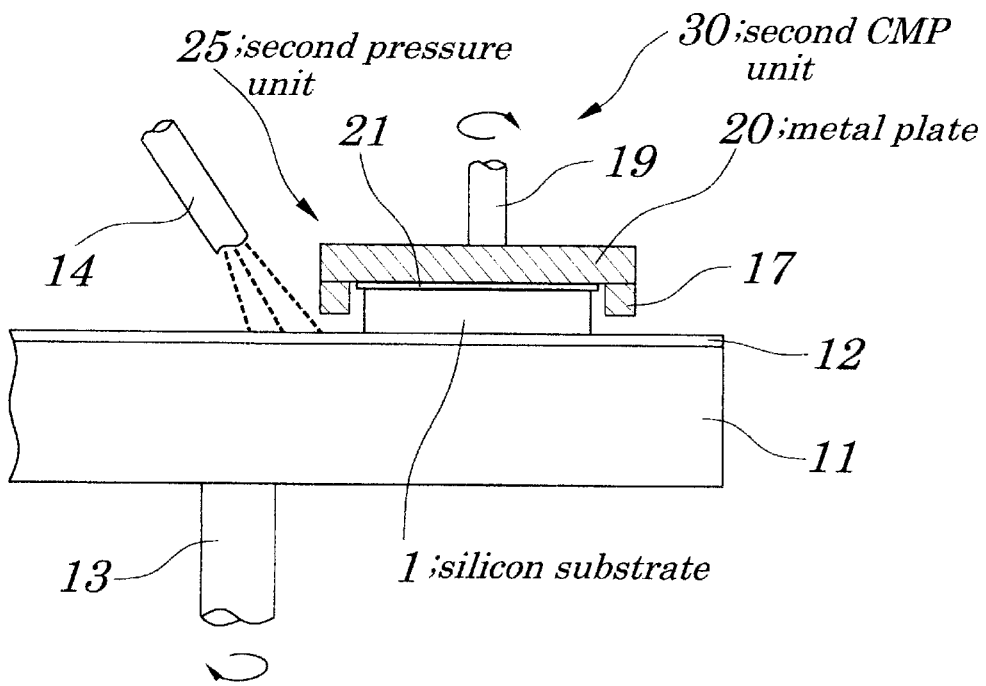
FIG. 5 is a sectional view of a second CMP unit used in the method of the present invention for manufacturing the semiconductor device.

FIG. 5 shows a sectional view of a second CMP unit 30 used in the above CMP process. As shown in FIG. 5, disposed over the polishing platen 11 in the second CMP unit 30 is a second pressure unit 25 for holding and forcing the silicon substrate 1 being polished against the polishing pad 12 of the polishing platen 11. The second pressure unit 25 is provided with a metal plate 20. The metal plate 20 serves as a second flexible element which is small in deformation, and forces the rear surface of the silicon substrate 1 downward, as viewed in FIG. 5, so that the silicon substrate 1 has its front surface forced against the polishing pad 12 of the polishing platen 11.

Incidentally, in FIG. 5, parts which are same as ones in FIG. 4 have been given same reference numerals and are not further explained.

In this first embodiment, now, the CMP process which is performed using both the first CMP unit 10 (shown in FIG. 4) and the second CMP unit 30 (shown in FIG. 5) will be described in detail.

First, the silicon substrate 1 which is still in a step of FIG. 1B is transferred to the first CMP unit 10 (shown in FIG. 4), and then has its front surface brought into press-contact with the polishing pad 12 under influence of a resilient force exerted on the rear surface of the silicon substrate 1 by the first flexible element or air bag 18 of the first pressure unit 15, wherein the air bag 18 is large in elastic deformation. Under such circumstances, the polishing or abrasive liquid is supplied from the nozzle 14 onto the polishing pad 12. Incidentally, the polishing liquid may be a product called QCTT-1010™, which is commercially available from Rodel Inc. of Wilmington, Del., U.S.A. Then, both the polishing platen 11 and the first pressure unit 15 are rotatably driven, so that the copper film 5 formed on the top surface of the barrier metal film 4 of the silicon substrate 1 is completely removed by polishing, as shown in FIG. 2A.

Subsequent to this, the silicon substrate 1 is transferred to the second CMP unit 30 in which the silicon substrate 1 has its front surface brought into contact with the polishing pad 12 and has its rear surface forced downward by the metal plate 20 serving as the second flexible element which is small in deformation in the second pressure unit 25. Under such circumstances, the polishing liquid is supplied from the nozzle 14 onto the polishing pad 12. Incidentally, the polishing liquid may be similar to the polishing liquid QCTT-1010™. After that, both the polishing platen 11 and the second pressure unit 25 are rotatably driven, so that the barrier metal film 4 formed on the top surface of the insulation film 2 is removed by polishing, as shown in FIG. 2B.

Figure 11:
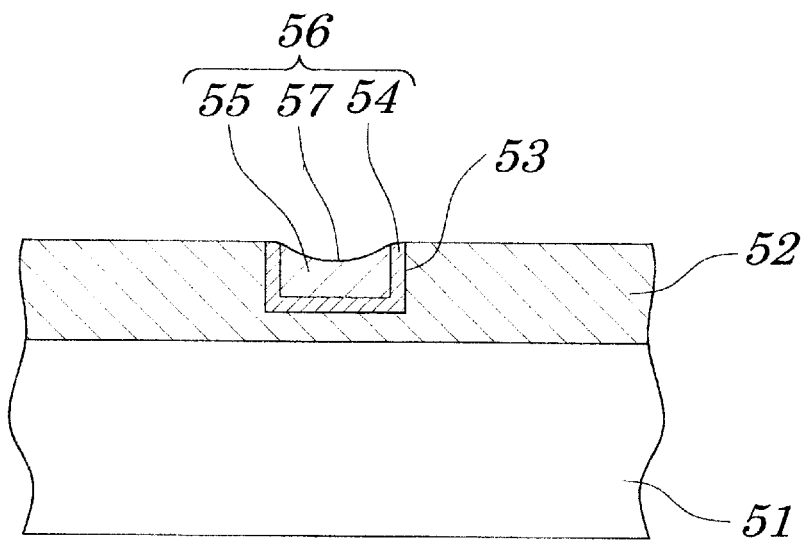
FIG. 11 is a sectional view of the semiconductor device produced by the conventional method of manufacturing, illustrating a dishing problem of the semiconductor device.

In the CMP process described above: polishing of the copper film 5 is performed by the first CMP unit 10 in which the first pressure unit 15 provided with the first flexible element or air bag 18 which is large in elastic deformation forces the rear surface of the silicon substrate 1 downward; and then, polishing of the barrier metal film 4 of the silicon substrate 1 is performed by the second CMP unit 30 in which the second pressure unit 25 provided with the second flexible element or metal plate 20 which is small in deformation forces the rear surface of the silicon substrate 1 downward. Due to this, it is possible for the first embodiment to increase a ratio of a removal rate of the copper film 5 to a removal rate of the barrier metal film 4, which makes it possible to prevent the copper film 5 from being over-polished when the barrier metal film 4 is polished. Consequently, it is possible for the first embodiment to effectively prevent both dishing 57 (shown in FIG. 11) and erosion 58 (shown in FIG. 12) from occurring in the semiconductor device. As a result, it is possible for the first embodiment to produce any fine wiring line, damascene wiring line, which is free from any deterioration in shape.

As described above, in the first embodiment having the above construction: the front surface of the silicon substrate 1 is brought into contact with the polishing pad 12 of the polishing platen 11 onto which the polishing liquid is supplied; the copper film 5 of the silicon substrate 1 is polished in a condition in which the rear surface of the silicon substrate 1 is forced downward by the first flexible element or air bag 18 of the first pressure unit 15; and, after completion of polishing of the copper film 5, the rear surface of the silicon substrate 1 is forced downward by the second flexible element or metal plate 20 (which is small in deformation) of the second pressure unit 25 in a manner such that the barrier metal film 4 is polished. Due to this, it is possible for the first embodiment to increase the ratio of the removal rate of the copper film 5 to the removal rate of the barrier metal film 4.

Consequently, in cases where the buried wiring line is formed by the CMP process, the first embodiment is capable of preventing the copper film 5 from being over-polished when the barrier metal film is polished.

SECOND EMBODIMENT

Figure 3A:
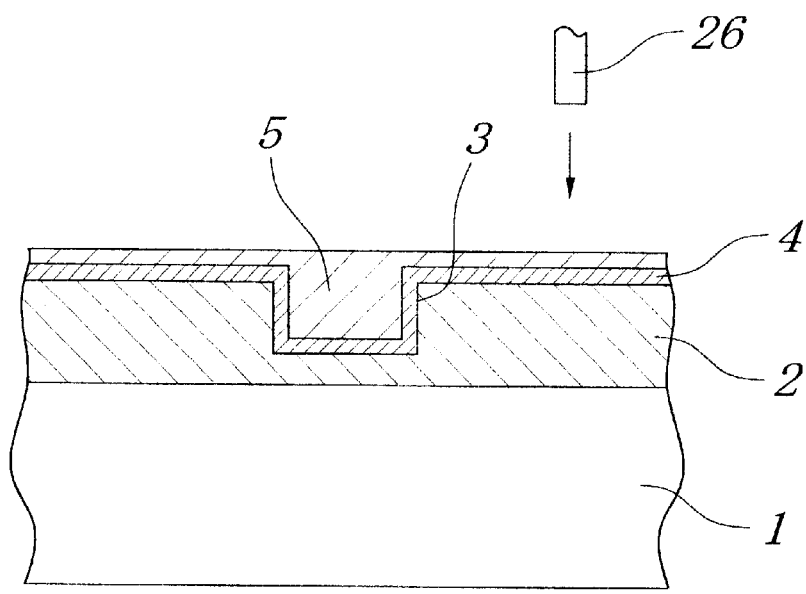
FIG. 3A is a sectional view of the silicon substrate having the copper film partially removed by polishing, illustrating a first process step of a second embodiment of a method of the present invention.
Figure 3B:
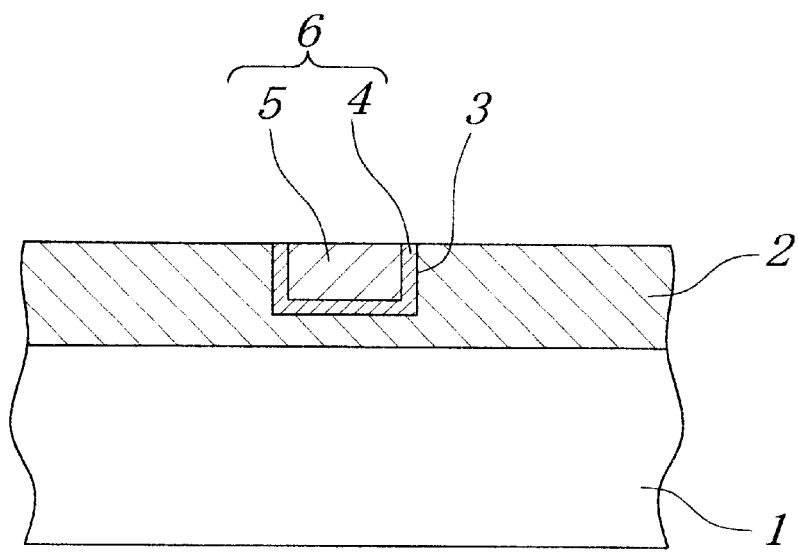
FIG. 3B is a sectional view of the silicon substrate, illustrating a second process step of the second embodiment of the method of the present invention.

FIG. 3A and FIG. 3B show respectively a series of process steps of a second embodiment of a method of the present invention for manufacturing a semiconductor device. The second embodiment differs from the first embodiment in permitting a part of a copper film having been formed on an uppermost surface of a barrier metal film 4 to remain unremoved after completion of polishing of the copper film.

With reference to FIGS. 3A and 3B, hereinbelow, the process steps of the second embodiment will be described in a step-by-step manner.

Figure 12:
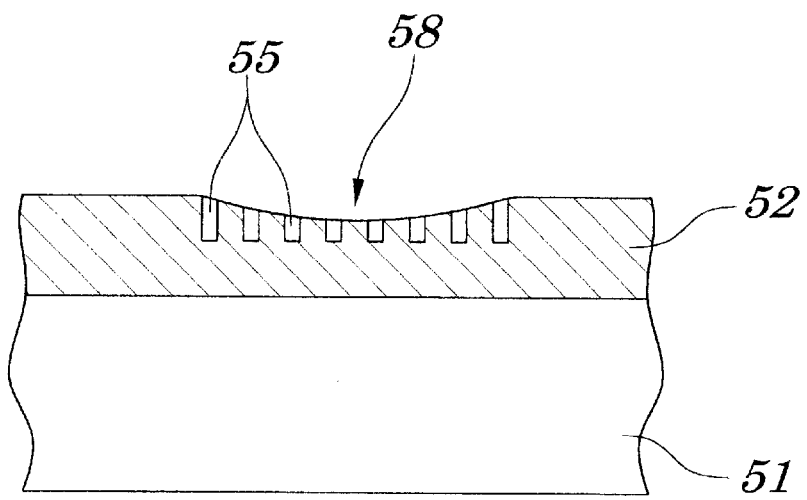
FIG. 12 is a sectional view of the semiconductor device produced by the conventional method of manufacturing, illustrating an erosion problem of the semiconductor device.

First, substantially same process steps as those of the first embodiment shown in FIGS. 1A, 12 and 1C are performed. After that, as shown in FIG. 3A, a silicon substrate 1 which is in a step of FIG. 1C is transferred to a first CMP unit 10 (shown in FIG. 4), where the silicon substrate 1 has its rear surface brought into press-contact with the first flexible element or air bag 18 (which is large in deformation), and therefore has its front surface brought into press-contact with a polishing pad 12 of the first CMP unit 10 In this condition, polishing liquid is supplied from nozzle 14 onto the polishing pad 12. As a result, a copper film 5 having been formed on the barrier metal film 4 of the silicon substrate 1 is polished. In this polishing operation, a part of the copper film 5 remains unremoved after completion of polishing of the copper film 5.

Then, as shown in FIG. 5, the silicon substrate 1 which is in a step of FIG. 3A is transferred to a second CMP unit 30, where the silicon substrate 1 has its rear surface brought into press-contact with a second flexible element or metal plate 20 (which is small in deformation), and therefore has its front surface brought into press-contact with the polishing pad 12 of the second CMP unit 30. In this condition, the polishing liquid is supplied from the nozzle 14 onto the polishing pad 12. As a result, both a remainder of copper film 5 and the barrier metal film 4 formed on a top surface of an insulation film 2 of the silicon substrate 1 are removed by polishing to form a buried wiring line 6 in the insulation film 2.

Shown in a top right-hand corner of FIG. 3A is an endpoint detecting unit 26, which is oppositely disposed from an outer surface of the copper film 5 of the silicon substrate 1 in a manner such that the endpoint detecting unit 26 detects a remaining film thickness of the copper film 5 having been polished. The endpoint detecting unit 26 may be constructed of an optical instrument, which is capable of detecting such remaining film thickness using a difference in reflectance of the polished surface of the copper film 5 at various light wavelengths.

In the second embodiment, by permitting part of the copper film 5 to remain unremoved from an entire top surface of the barrier metal film 4, it is possible to control an amount of material to be removed from the top surface of the barrier metal film 4 when the barrier metal film 4 is polished. Due to this, it is possible for the second embodiment to permit an entire polishing process to gain flexibility.

As is clear from the above, the second embodiment having the above construction may enjoy substantially a same effect as that obtained in the first embodiment.

In its essence, the second embodiment may increase flexibility in polishing the surface of the silicon substrate.

THIRD EMBODIMENT

Figure 6:
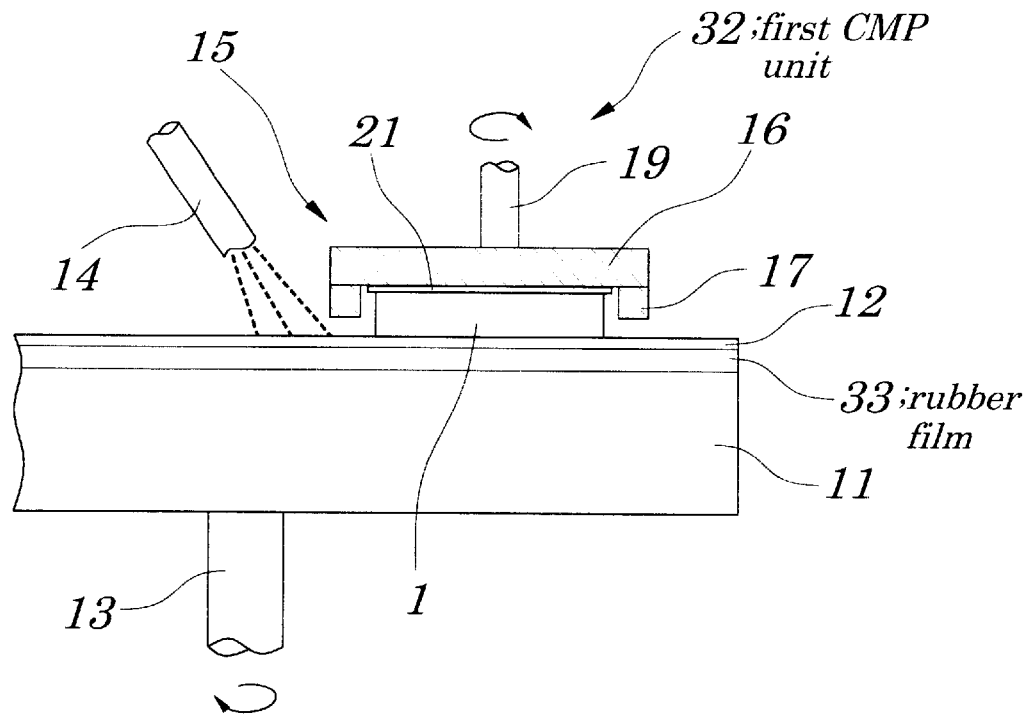
FIG. 6 is a sectional view of the first CMP unit used in a third embodiment of the method of the present invention.
Figure 7:
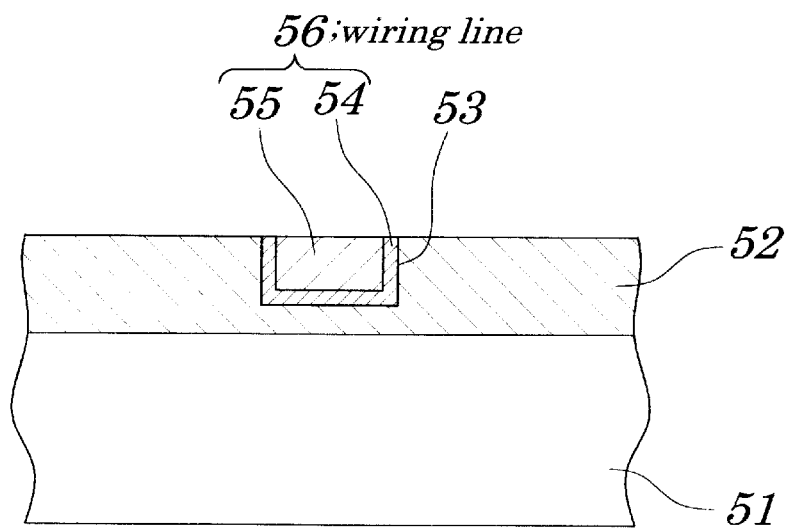
FIG. 7 is a sectional view of a silicon substrate, illustrating a typical damascene structure in description of the relate art.
Figure 8A:
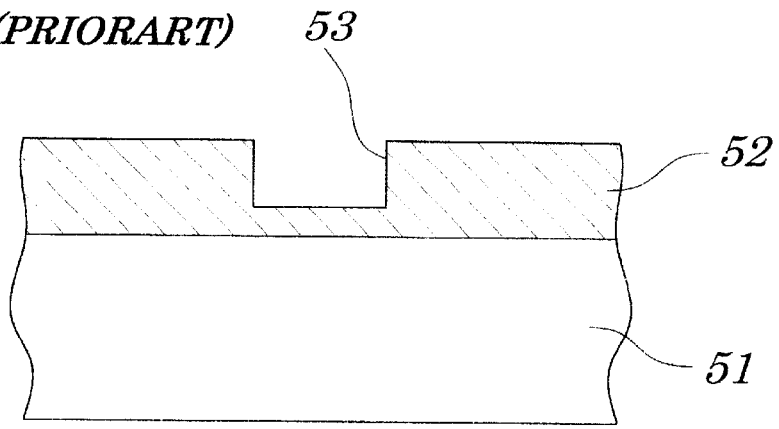
FIG. 8A is a sectional view of a silicon substrate coated with an insulation film, illustrating a first process step of a conventional method of manufacturing a semiconductor device.
Figure 8B:
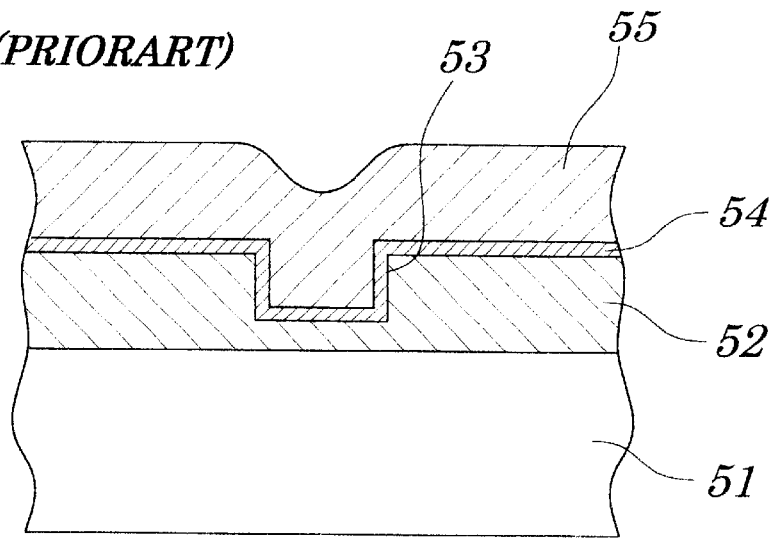
FIG. 8B is a sectional view of the silicon substrate further coated with a barrier metal film and a copper film, illustrating a second process step of the conventional method.
Figure 8C:
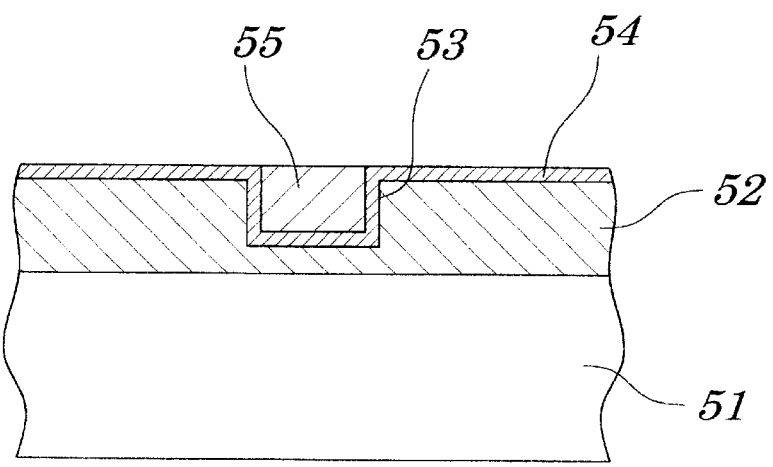
FIG. 8C is a sectional view of the silicon substrate having its copper film polished, illustrating a third process step of the conventional method.
Figure 9:
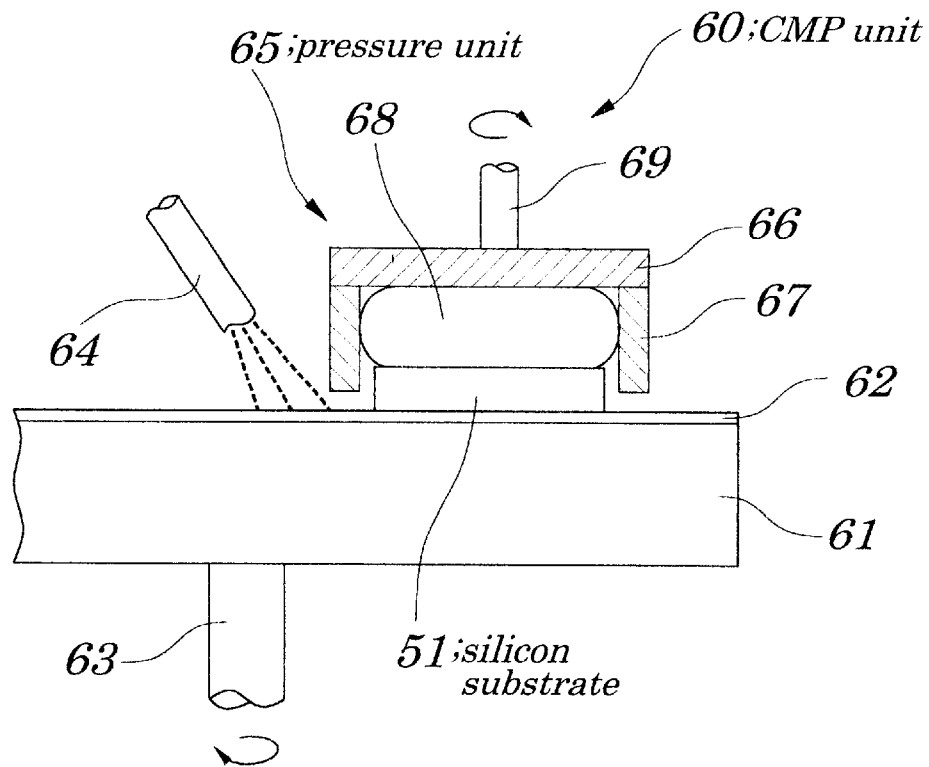
FIG. 9 is a sectional view of a conventional CMP unit used in the conventional method of manufacturing the semiconductor device, illustrating an air bag used therein.
Figure 10:
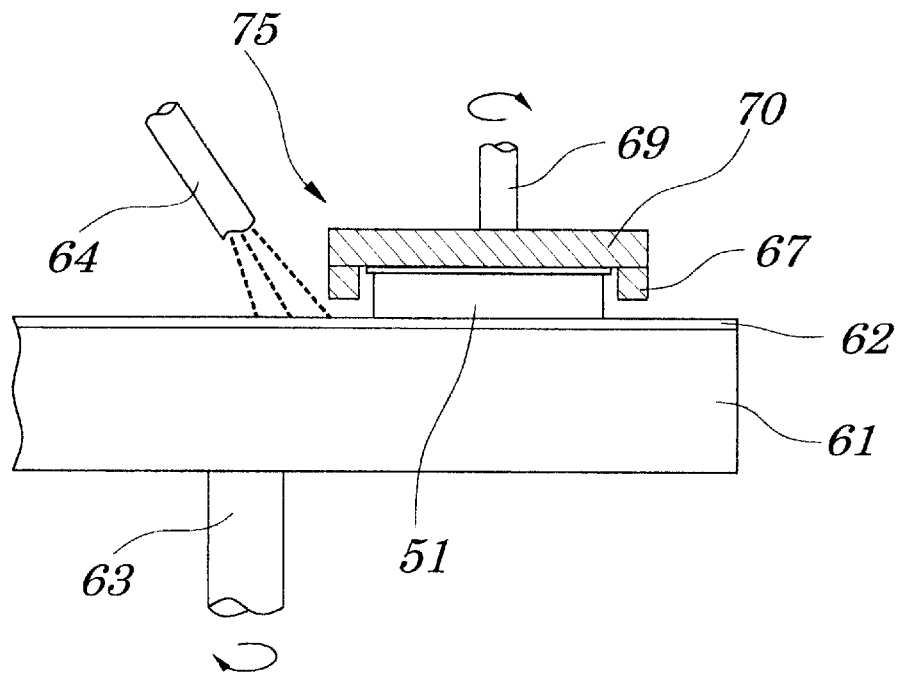
FIG. 10 is a sectional view of the conventional CMP unit used in the conventional method, illustrating a metal plate used therein.

FIG. 6 shows a sectional view of a first CMP unit used in a method of manufacturing a semiconductor device according to a third embodiment of the present invention.

The third embodiment of a method differs from the first embodiment in modifying the first CMP unit used therein. Hereinbelow, a thus modified first CMP unit 32 will be described in detail with reference to FIG. 6.

Although the first CMP unit 10 (shown in FIG. 4) used in the first embodiment has its first flexible element or air bag 18 which is large in deformation brought into press-contact with a rear surface of a silicon substrate 1 to urge the silicon substrate 1 downward, the first CMP unit 32 used in the third embodiment has its flexible element, or rubber film 33 brought into press-contact with a front surface of the silicon substrate 1. In other words, as is clear from FIG. 6, in the first CMP unit 32 used in the third embodiment, a polishing, platen 11 also serves as a pressure unit. More specifically, the rubber film 33, which is large in elastic deformation and serves as the first flexible element, is attached to a top surface of the polishing platen 11. A polishing pad 12 is then attached to a top surface of the rubber film 33, and has its upper surface brought into press-contact with the front surface of the silicon substrate 1. Consequently, in the pressure unit provided with the rubber film 33 used in polishing the copper film 5, it is also possible to use rubber film 33 for forcing not only the rear surface of the silicon substrate 1, but also the front surface of the silicon substrate 1.

After completion of polishing of copper film 5, barrier metal film 4 is then polished. At this time, a second CMP unit 30 (shown in FIG. 5) is used in the third embodiment as is in the first embodiment.

In the third embodiment having the above construction, by only partially modifying the polishing platen 11, it is possible to provide at a low cost a first pressure unit having the rubber film 33 which is large in elastic deformation, which makes it simple to construct the third embodiment of the method of the present invention.

As described above, it is also possible for the third embodiment to obtain substantially a same effect as that obtained in the first embodiment.

Further, in the third embodiment, it is possible to simplify construction of the pressure unit.

It is thus apparent that the present invention is not limited to the above embodiments but may be changed and modified without departing from the scope and spirit of the invention.

For example, the air bag 18 used as the first flexible element which is large in elastic deformation, may also serve as the second flexible element which is small in deformation when the air bag 18 reduces a degree of expansion thereof. In this case, it is possible to use a same polishing platen in both the step for polishing the copper film and the step for polishing the barrier metal film. This makes it possible to simplify construction of the CMP unit used in the present invention.

Further, it is also possible to use any fluid-filled bag as the flexible element in place of the air bag 18.

Still further, it is possible to use a same polishing liquid in both the polishing process of the copper film and the polishing process of the barrier metal film. It is also possible for the step for polishing the barrier metal film to use another polishing liquid which is different from the polishing liquid used in the step for polishing the copper film. It is also possible to select the polishing liquid arbitrarily according to purposes, applications and a like.

Further, the present invention is effectively applied not only to damascene wiring structure, but also to dual damascene wiring structure which has been employed in current multi-level wiring techniques.

Still further, though a barrier metal film which is made of particularly tantalum or tantalum nitride is excellent in film-formation properties and like properties, the barrier metal film may be made of any other suitable materials, for example such as tungsten nitride (WN), tungsten silicon nitride (WSiN), tantalum silicon nitride (TaSiN), or the like. As for an insulation film, its material, film thickness, film formation processes and other fabrication conditions all described above are only illustrative examples, and therefore may be modified depending on its purposes, applications and like.

Finally, the present application claims the Convention Priority based on Japanese Patent Application No. Hei 11-226900 filed on Aug. 10, 1999, which is herein incorporated by reference.

What is claimed is:

1. A method of manufacturing a semiconductor device, wherein: after a trench for a wiring line is formed in an insulation film covering a surface of a semiconductor substrate, a first and a second metal film are subsequently formed over an entire surface of said insulation film including said trench; and, said first and said second metal film formed on a top surface of said semiconductor substrate through said insulation film are subsequently polished by a chemical mechanical polishing process to form a buried wiring line, said method of manufacturing said semiconductor device comprising:

a first polishing step for polishing said second metal film in a condition in which a polishing liquid is supplied to a polishing platen, and said semiconductor substrate having its surface forced against said polishing platen is brought into press-contact with a first flexible element which is large in deformation; and a second polishing step for polishing said first metal film in a condition in which a polishing liquid is supplied to said polishing platen, and said semiconductor substrate having its surface forced against said polishing platen is brought into press-contact with a second flexible element which is small in deformation.

2. The method of manufacturing the semiconductor device, according to claim 1, wherein said first polishing step is performed in a manner such that a part of said second metal film formed on said top surface of said semiconductor substrate still remains after completion of performance of said first polishing step.

3. The method of manufacturing the semiconductor device, according to claim 1, wherein said polishing liquid is shared by both said first and said second polishing step.

4. The method of manufacturing the semiconductor device, according to claim 1, wherein said polishing liquid used in said second polishing step is different from that used in said first polishing step.

5. The method of manufacturing the semiconductor device, according to claim 1, wherein said trench for said wiring line is constructed of: a trench portion a depth of which reaches a midpoint in film thickness of said insulation film; and, a via hole forming a through-hole of said insulation film, said through-hole extending in a direction perpendicular to said top surface of a semiconductor substrate.

6. The method of manufacturing the semiconductor device, according to claim 1, wherein: said first metal film is composed of barrier metal which is capable of forming a barrier metal film; and, said second metal film is composed of copper or copper-based alloys.

7. The method of manufacturing the semiconductor device, according to claim 1, wherein said barrier metal is tantalum or tantalum nitride.

8. A method of manufacturing a semiconductor device, wherein: after a trench for a wiring line is formed in an insulation film covering a surface of a semiconductor substrate, a first and a second metal film are subsequently formed over an entire surface of said insulation film including said trench; and, said first and said second metal film formed on a top surface of said semiconductor substrate through said insulation film are subsequently polished by a chemical mechanical polishing process to form a buried wiring line, said method of manufacturing said semiconductor device comprising:

a first polishing step for polishing said second metal film in a condition in which a polishing liquid is supplied to a polishing platen, and said semiconductor substrate having its surface forced against said polishing platen is brought into press-contact with a first pressure unit provided with a first flexible element which is large in deformation; and a second polishing step for polishing said first metal film in a condition in which a polishing liquid is supplied to said polishing platen, and said semiconductor substrate having its surface forced against said polishing platen is brought into press-contact with a second pressure unit provided with a second flexible element which is large in deformation.

9. The method of manufacturing the semiconductor device, according to claim 8, wherein said first polishing step is performed in a manner such that a part of said second metal film formed on said top surface of said semiconductor substrate still remains after completion of performance of said first polishing step.

10. The method of manufacturing the semiconductor device, according to claim 8, wherein said polishing liquid is shared by both said first and said second polishing step.

11. The method of manufacturing the semiconductor device, according to claim 8, wherein said polishing liquid used in said second polishing step is different from that used in said first polishing step.

12. The method of manufacturing the semiconductor device, according to claim 8, wherein said trench for said wiring line is constructed of: a trench portion a depth of which reaches a midpoint in film thickness of said insulation film; and, a via hole forming a through-hole of said insulation film, said through-hole extending in a direction perpendicular to said top surface of a semiconductor substrate.

13. The method of manufacturing the semiconductor device, according to claim 8, wherein: said first metal film is composed of barrier metal which is capable of forming a barrier metal film; and, said second metal film is composed of copper or copper-based alloys.

14. The method of manufacturing the semiconductor device, according to claim 8, wherein said barrier metal is tantalum or tantalum nitride.

15. A chemical mechanical polishing apparatus provided with a polishing platen for sequentially polishing a second and a first metal film both formed on a top surface of a semiconductor substrate through an insulation film including a trench for a wiring line, wherein said first and said second metal film are sequentially formed over an entire top surface of said semiconductor substrate through said insulation film, said chemical mechanical polishing apparatus comprising:

a first pressure unit provided with a first flexible element which is large in deformation, said first flexible element urging said semiconductor substrate against said polishing platen when said second metal film is polished; and a second pressure unit provided with a second flexible element which is small in deformation, said second flexible element urging a rear surface of said semiconductor substrate when said first metal film is polished.

16. The chemical mechanical polishing apparatus according to claim 15, wherein said first flexible element which is large in deformation is composed of an air bag filled with a pressurized fluid.

17. The chemical mechanical polishing apparatus according to claim 15, wherein said first flexible element which is large in deformation is composed of a rubber member mounted on a surface of said polishing platen.

18. The chemical mechanical polishing apparatus according to claim 15, wherein said second flexible element which is small in deformation is composed of a metal plate.

* * * * *